United States Patent
Andersson et al.

(10) Patent No.: US 10,025,893 B2
(45) Date of Patent: Jul. 17, 2018

(54) PREDICTION OF LIFE CONSUMPTION OF A MACHINE COMPONENT

(75) Inventors: Magnus Andersson, Trollhattan (SE); Anders Larsson, Vargon (SE)

(73) Assignee: GKN Aerospace Sweden AB, Trollhattan (SE)

(*) Notice: Subject to any disclaimer, the term of this patent is extended or adjusted under 35 U.S.C. 154(b) by 505 days.

(21) Appl. No.: 14/407,628

(22) PCT Filed: Jun. 19, 2012

(86) PCT No.: PCT/SE2012/000094
§ 371 (c)(1),
(2), (4) Date: Mar. 24, 2015

(87) PCT Pub. No.: WO2013/191594
PCT Pub. Date: Dec. 27, 2013

(65) Prior Publication Data
US 2015/0227659 A1    Aug. 13, 2015

(51) Int. Cl.
*G06F 17/50* (2006.01)
*G05B 23/02* (2006.01)
(Continued)

(52) U.S. Cl.
CPC ............ *G06F 17/5018* (2013.01); *B64F 5/60* (2017.01); *G05B 23/0254* (2013.01);
(Continued)

(58) Field of Classification Search
CPC ........ G06F 17/5018; G06F 17/10; B64F 5/60; G05B 23/0254; G05B 23/0283; G07C 5/085; F01K 23/00
(Continued)

(56) References Cited

U.S. PATENT DOCUMENTS 3,588,265 A * 6/1971 Berry ............... F01D 19/02
                                                      415/1
4,215,412 A * 7/1980 Bernier ............ G07C 3/00
                                                      701/100
(Continued)

FOREIGN PATENT DOCUMENTS

EP    2390742 A1    11/2011
EP    2434362 A2    3/2012

OTHER PUBLICATIONS (Assessing Useful Life of Turbomachinery Components, Proceedings of the Thirty-Fourth Turbomachinery Symposium, 2005).*
(Continued)

*Primary Examiner* — Brian S Cook
(74) *Attorney, Agent, or Firm* — Bejin Bieneman PLC

(57) ABSTRACT

A life consumption of a component in a machine may be predicted. Load data may be received from a load session of the machine. A plurality of parameter sets may be accessed, each associated with a critical point of the component, which point is considered to have critical life consumption. For each critical point, life consumption may be calculated using a life consumption calculation model receiving the load data and the parameter sets as input. By selecting a plurality of critical points on the component, a more complete view is presented of how the different parts of the component are affected by the load session.

19 Claims, 4 Drawing Sheets

(51) Int. Cl.
G07C 5/08 (2006.01)
G06F 17/10 (2006.01)
B64F 5/60 (2017.01)
F01K 23/00 (2006.01)

(52) U.S. Cl.
CPC ......... *G05B 23/0283* (2013.01); *G06F 17/10* (2013.01); *G07C 5/085* (2013.01); *F01K 23/00* (2013.01)

(58) Field of Classification Search
USPC .......................................................... 703/2
See application file for complete search history.

(56) References Cited

U.S. PATENT DOCUMENTS

| | | | |
|---|---|---|---|
| 5,210,704 | A | 5/1993 | Husseiny |
| 6,301,970 | B1 | 10/2001 | Biggs |
| 6,490,543 | B1 | 12/2002 | Jaw |
| 6,774,786 | B1 * | 8/2004 | Havekost ........... G05B 23/0272 340/500 |
| 7,149,657 | B2 | 12/2006 | Goebel et al. |
| 7,197,430 | B2 | 3/2007 | Jacques et al. |
| 8,082,115 | B2 * | 12/2011 | Bechhoefer ............. F03D 7/047 290/44 |
| 2006/0243055 | A1 | 11/2006 | Sundermeyer et al. |
| 2007/0198215 | A1 | 8/2007 | Bonanni |
| 2008/0040152 | A1 | 2/2008 | Vian et al. |
| 2009/0254286 | A1 * | 10/2009 | Tulyani ............... G06F 17/5009 702/34 |
| 2009/0306909 | A1 | 12/2009 | Mattes |
| 2011/0060568 | A1 | 3/2011 | Goldfine et al. |
| 2011/0106510 | A1 | 5/2011 | Poon |
| 2011/0137575 | A1 | 6/2011 | Koul |
| 2012/0051911 | A1 * | 3/2012 | Baik ................... G01M 5/0016 416/61 |
| 2012/0101706 | A1 * | 4/2012 | Masse ................ G05B 23/0221 701/100 |

OTHER PUBLICATIONS

Kadhim_2011 (Effective strain damage model associated with finite element modelling and experimental validation, International Journal of Fatigue 36 (2012) 194-205. available online Jul. 30, 2011).*
Inman_2005 (Damage Prognosis for Aerospace, Civil and Mechanical Systems, John Wiley & Sons, Ltd. 2005).*
Lyyer_2007 (Aircraft life management using crack initiation and crack growth models—P-3C Aircraft experience, International Journal of Fatigue 29 (2007) 1584-1607).*
PAContorl_2006 (Instrumentation & Control: Process Control Fundamentals, 2006, downloaded from www.PAControl.com).*
Control_Loop_Wiki (Control Loop Defined, Wikipedia, downloaded from https://en.wikipedia.org/wiki/Control_loop).*
Ray_1994 (Fatigue damage control of mechanical systems, Smart Mater, Struct. 3 (1994) 47-58. UK).*
Lee_1999 (Computer-aided Maintenance: Methodologies and Practices, Springer US, 1999).*
Abbas_2009 (A System-Level Approach to Fault Progression Analysis in Complex Engineering Systems, Annual Conference of the Prognostics and Health Management Society, 2009).*
Singh_2005 (Assessing Useful Life of Turbomachinery Components, Proceedings of the Thirty-Fourth Turbomachinery Symposium, 2005).*

International Search Report for PCT/SE2012/000096 dated May 2, 2013 (5 pages).
Written Opinion of the International Searching Authority for PCT/SE2012/000096 dated May 2, 2013 (6 pages).
International Search Report for PCT/SE2012/000094 dated May 2, 2013 (5 pages).
Written Opinion of the International Searching Authority for PCT/SE2012/000094 dated May 2, 2013 (8 pages).
International Search Report for PCT/SE2012/000093 dated May 2, 2013 (5 pages).
Written Opinion of the International Searching Authority for PCT/SE2012/000093 dated May 2, 2013 (7 pages).
International Search Report for PCT/SE2012/000095 dated May 2, 2013 (5 pages).
Written Opinion of the International Searching Authority for PCT/SE2012/000095 dated May 2, 2013 (7 pages).
Pfoertner, H. "The information content of turbine engine data—a chance for recording-based life usage monitoring", Aerospace Conference Proceedings, 2002. IEEE Piscataway, NJ, USA, Mar. 9-16, 2002, vol. 6, p. 2975-2985. Publication date Mar. 9, 2002. ISBN 978-0-7803-7231-3; ISBN 0-7803-7231-Xs.
Iyyer; Sarkar N; Merrill S; Phan R; N, "Aircraft life management using crack initiation and crack growth models—P-3C Aircraft experience" International Journal of Fatigue, vol. 29, No. 9-11, p. 1584-1607 (2007). Butterworth Scientific Ltd, Guildford, GB. Publication date Aug. 23, 2007. ISSN 0142-1123 doi: 10.1016/j.ijfatigue.2007.03.017.
Papzian J M; Anagnostou E L J; Engel S; Fridline D; Hoitsma D; Madsen J; Nardiello J; Silberstein R P; Welsh G; Whiteside J B, "SIPS, A Structural Integrity Prognosis System," Aerospace Conference, 2007 IEEE, Piscataway, NJ, USA (Ed.Le Pera A; Forni F; Grossi M; Lucente M; Palma V; Rossi T; Ruggieri M), p. 1-10, Publication date: Mar. 3, 2007, ISBn 978-1-4244-0524-4; ISBN 1-4244-0524-6.
Kadhim N A ; Abdullah S; Ariffin A K, "Effective strain damage model associated with finite element modelling and experimental validation," International Journal of Fatigue, vol. 36, No. 1, 194-205 (2011). Publication date Jul. 18, 2011. ISSN 0142-1123, doi: 10.1016/j.ijfatigue.2011.07.012.
International Preliminary Report on Patentability for PCT/SE2012/000096 dated Dec. 31, 2014 (7 pages).
International Preliminary Report on Patentability for PCT/SE2012/000094 dated Dec. 31, 2014 (10 pages).
International Preliminary Report on Patentability for PCT/SE2012/000093 dated Dec. 31, 2014 (8 pages).
International Preliminary Report on Patentability for PCT/SE2012/000095 dated Dec. 31, 2014 (8 pages).
Non-Final Office Action for U.S. Appl. No. 14/407,631 dated May 17, 2017.
Non-Final Office Action dated Aug. 16, 2017 for U.S. Appl. No. 14/407,634 (16 pages).
Final Office Action dated Nov. 15, 2017 for U.S. Appl. No. 14/407,631 (56 pages).
Bogard_2011 (Numerical Modeling of Fatigue Damage and Fissure Propagation under Cyclic Loadings, International Journal of Damage Mechanics, SAGE Publications, 2008, 174 (2), pp. 173-187. <10.1177/1056789508088961>. <hal-00571173>).
LeVeque_2005 (Finite Difference Methods for Differential Equations, AMath 585-586 University of Washington Version of Sep. 2005).
Non-Final Office Action for U.S. Appl. No. 14/407,623 dated Feb. 7, 2018 (78 pages).

* cited by examiner

PREDICTION OF LIFE CONSUMPTION OF A MACHINE COMPONENT

CROSS-REFERENCE TO RELATED APPLICATIONS

This application is a National Phase of, and claims priority to, International Application No. PCT/SE2012/000094 filed on Jun. 19, 2012, which application is hereby incorporated by reference in its entirety.

BACKGROUND

Today, there is significant interest in developing the prediction of the life consumption of individual components in a machine, in particular in machines with moving parts. By improving the accuracy of such methods and systems, the applied safety limits may be reduced, and unnecessary replacement of components may be avoided. When applied to an entire fleet (e.g., a military aircraft fleet) the cost savings may be significant as well as allowing for an increased operational lifetime. Furthermore, in the unusual event that conventional methods are too optimistic, refined methods may avoid failure of components, thus avoiding uncalculated stops in operation or even more importantly accidents.

Examples of interesting applications where improved life consumption predictions may be useful include aircrafts, gas/steam turbines, trucks, loaders, nuclear plants and wind turbines.

A conventional method for predicting the life consumption of a component in a machine is to measure one or a combination of the usage/run time, distance or count the number of cycles of a predefined load session or a conservative load session. A load session is the time when the machine is in operation, for example for an aircraft a load session may be defined as flying from point A to point B with a predefined rotor speed variation.

In the field of aircrafts, the life consumption of an engine is sometimes determined by making a "simplified" cycle count, focusing on the usage of a specific engine component. There are also available more specific and at least in some sense more reliable methods where, e.g., ELCF (equivalent low cycle fatigue) cycles for the specific, for example, engine component is determined. Such ELCF cycles may for example be calculated based on the high pressure rotor speed of an aircraft jet engine recorded during a load session. The cycles may be determined by the number of times the high pressure rotor speed exceeds certain selected and predefined rotor speeds. Furthermore, to calculate the ELCF cycles, scale factors are determined for the cycles based on predetermined load sessions. However, a major drawback with the ELCF cycles is that the prediction of life consumption will have errors if the actual load sessions experienced by an individual differs significantly from the predetermined load sessions, which the scale factors are based upon.

In order to more accurately determine the life consumption of an, e.g., engine, the life consumption for relevant components in the engine must be determined. In order to determine the life consumption of specific components, more detailed knowledge of conditions in separate parts of the engine is required.

In EP2390742, an improved method of approximating engine life usage is described, using a system with a set of simplified usage counters. The set of simplified usage counters, severity counters (SC), is used to estimate the damage of an aircraft engine during use. The severity counters are functions relating to a specific engine parameter, such as high pressure shaft speed, torque, exhaust gas temperature in combination with engine flight time. The same severity counter could be used to approximate the damage in several components of the engine. Correlation between the counters and the damage in the engine is calibrated by an exact calculation of the accumulated damage. To slightly improve the approximations of the damage, Monte Carlo simulations of a fleet of engines are used as a statistical approach to avoid always assuming the worst-case damage.

As demands for cost efficiency have increased, the interest in finding a better model for predicting life consumption has also increased. The conventional methods do not take all significant load cycles into consideration.

For example, the method of counting ELCF-cycles only considers one engine parameter of the entire engine while the life consumption of the critical components in an engine or machine may vary depending on which loads are most important for the life consumption of respective component. The method presented in EP2390742 fails to convey a refined method for predicting life consumption with regards to damages depending on all the different load sessions experienced by each individual.

Hence, there is a need for an improved more accurate method for predicting the life consumption of components in a machine based on all actual load sessions with enhanced focus on both safety and cost-efficient aspects.

SUMMARY

Disclosed herein are a method, a system and a computer program product for predicting a life consumption of a component in a machine. The life consumption indicates the amount of damage in the component. Thus, this disclosure includes an improved method and system for predicting life consumption of a component in a machine with improved reliability.

According to a first aspect, the above is at least partly met by a method for predicting a life consumption of a component in a machine, comprising receiving load data from a load session of said machine, accessing a plurality of parameter sets, each associated with a critical point of said component, which point is considered to have critical life consumption, and for each critical point, calculating life consumption using a life consumption calculation model receiving the load data and the parameter sets as input.

According to a second aspect, the above is at least partly met by a system for predicting a life consumption of a component in a machine, the system comprising: a load creation unit configured to receive load data from a load session of said machine, a model unit configured to access a plurality of parameter sets, each associated with a critical point of said component, which point is considered to have a critical life consumption, a calculation engine configured to calculate the life consumption in each critical point using a life consumption calculation model receiving the load data and the parameter sets as input.

The above first and second aspects provide similar features and advantages, which will be described below. The present disclosure is based on the realization that the possibility of predicting the life consumption for several critical points on a single component in an engine will greatly improve the safety aspects regarding predictions of life consumption. By selecting a plurality of critical points on the component, a more complete view is presented of how the different parts of the component are affected by the load session. The life limiting location of a component may vary depending on the load session. The machine may be any type of machine for example aircrafts, gas/steam turbines, trucks, loaders, nuclear plants and wind turbines.

The term "life consumption" should be interpreted as the ratio between the cumulated damage from the load sessions and the total amount of damage that a component, machine or a point is able to endure without failure. The life consumption may be calculated in percentages of the total damage the component may endure without failure. Moreover, a load session should be understood as an operational cycle for a machine, for example, a flight mission for an aircraft. The plurality of parameter sets may further be developed from development models used during the product development phase.

An advantage with performing the calculations for a plurality of critical points on the component is that the predicted life consumption for the entire component becomes more reliable and may further give information on how the plurality of critical points are affected by each load session.

In prior art solutions, a single point on each component is established as critical to life consumption, based on a typical use of the component. This point is used to predict and evaluate life consumption. However, in reality, if the use of the component deviates from the expected use, it is possible that another point will in fact be more damaged, and thus determine the life consumption. By selecting a plurality of points and predict life consumption for all these points, this situation is avoided, or at least reduced.

By improving accuracy and reliability, the presently disclosed subject matter provides for reducing the safety factor of the predictions. The safety margin may be reduced, thus allowing for setting a critical limit of the life consumption closer to the predicted life limit of the component. Consequently, parts can be used longer, resulting in a reduction of spare part cost. Furthermore, information regarding the effects of each load session enables operational settings of the machine to be altered or adjusted such that a more evenly distributed life consumption is generated for the different points on the component.

By associating each critical point with a parameter set, adapted to be used as input by a calculation model for calculating life consumption, a very efficient processing of the load data can be achieved.

The parameter sets may include settings and parameters regarding, for example, a part number of the component that the parameter set is valid for material data, safety factor, location of the critical point, thermal and stress model settings, FE-models and failure mode settings. In a machine, a number of components may be life limiting components, typical life limiting components may for example be discs in rotating parts. Life limiting components should be understood as components that may limit the life of the product. The life limiting location of a component should be understood as the location predicted to fail first, i.e. one critical point of the plurality of critical points. The different parameter sets will be further described below.

The parameter sets will in themselves act as a documentation of the component in respect of life consumption. After extensive testing and validation of the parameter sets during the development phase, such parameter sets can be used as "approved data" in the delivery of a component.

During design of a component, parameter sets for several critical points may be used to predict a life consumption for a predetermined load session mix. This predicted life consumption may then be used to redesign the component and to adapt the parameter set for each critical point to match a redesigned component. By evaluating the results from the predicted life consumption, the design of the component may be altered and improved based on different simulated load sessions for a component. The parameter sets may then be adapted to predict life consumption for the new design of the component.

The life consumption calculation model may be adapted to use different calculation methods based on the conditions in a critical point. The parameter set may determine which life consumption calculation model that may be used when calculating the life consumption. For critical points located in "cold" locations, where temperature loads are small compared to the mechanical loads, the life consumption calculation model may be adapted to neglect the temperature loads. By adapting the parameter sets to include information about which calculation model to use for each critical point, based on the situation of the location, the prediction of the life consumption may be performed faster.

According to an example embodiment, the life consumption may be calculated for a plurality of load sessions and accumulated for each critical point.

By applying a plurality of parameter sets associated with different critical points in a specific component, the damage in each of the several critical points may be accumulated, thus reducing the uncertainty of the life limiting location. The operational setting of the machine may also be adapted to alter the load during load sessions such that more damage may be accumulated in components which are cheaper to replace or have a low accumulated life consumption compared to other components in the engine.

According to an example embodiment, the critical points considered to have critical life consumption may be selected through the steps of applying a mesh to a geometric model of the component, the mesh comprising a plurality nodes, calculating at least one of a stress pattern and a temperature pattern of said mesh for at least one predetermined load session by means of a mesh based numerical method, calculating a predicted life consumption for each of the plurality of nodes based on said at least one of said stress pattern and said temperature pattern for each predetermined load session using the life consumption calculation model, selecting, based on the predicted life consumption, a plurality of selected nodes considered to have a critical life consumption, the plurality of selected nodes forming the critical points.

The term mesh should be understood as a grid of elements, wherein each corner in the grid is a node. Moreover, the mesh may be applied to a 2D or a 3D geometric model.

The wording "mesh based numerical method" should in the following and throughout the entire description be interpreted as a method using explicit- or implicit iterative calculations in order to achieve a desired result. The mesh based numerical method may use a mesh or a grid provided to, e.g., 2D or 3D geometric models, which calculates, e.g., stresses and temperature for each node and/or element provided by the mesh/grid. Accordingly, the following description of a mesh based numerical model should be interpreted as a model utilizing a mesh based numerical method for calculating stresses, strains and temperature. The mesh based numerical method may, for example, use a finite element method, FEM, to calculate stresses and/or strains.

It may be advantageous to calculate a temperature pattern to further improve prediction of the life consumption.

Furthermore, the life consumption may be predicted by means of calculating principal stresses and/or strains exposed to the structure in combination with temperature loads. Calculation of principal stresses and/or strains can, by use of, e.g., a Wohler diagram or the like, be used to determine the amount of life consumption being utilized by the component. When, as described above, adding predicted life consumption for a first load session to the predicted life consumption of a second load session, it may be essential to compare and add principal stresses having the same principal directions. The highest level of the first principal stress/strain during the load session may be calculated such that a direction of that principal stress/strain with the highest level may be determined. The stress/strain level may then be calculated in the determined direction for every point in time in the load sessions. Moreover, the calculation may be used for determining and detecting crack initiation or crack propagation of a component, since cracks are one important aspect when determining life consumption.

By predicting and evaluating the life consumption for different predetermined load sessions of the component, a plurality of nodes may be selected that represents the most critical nodes of the component, where each of the most critical nodes may limit the life expectancy of the component. A zone with critical life consumption may, for example, be a zone around a hole. The zone may comprise several nodes with the same critical life consumption and, based on evaluation, one node may be selected to represent those nodes in the zone encircling the hole.

According to an example embodiment, the mesh based numerical method may include a finite element analysis method.

According to an example embodiment, a critical limit of the life consumption may be determined and a maintenance action for the component may further be determined, when the life consumption in one of the critical points on the component has reached the critical limit.

When the critical limit of the life consumption has been reached by one of the plurality of critical points, a maintenance action is determined. The maintenance action may include, e.g., replacing the component or performing service on the component.

According to an example embodiment, the parameter set for a critical point may be modified to a modified parameter set, and the predicted life consumption for the critical point may be recalculated using the life consumption calculation model with the respective modified parameter set for a set of previously calculated load sessions.

The life consumption may be recalculated based on updated parameter sets if the load data for each of the load session remains. The possibility of re-using load sessions for updated parameter sets and updated life consumption calculation models improves the flexibility of the method.

According to an example embodiment, the life consumption calculation model may comprise a mesh based numerical model. The mesh based numerical model may calculate stress, strain and/or temperature of the component by means of the above mentioned mesh based numerical method.

According to an example embodiment, the mesh based numerical model may be used for training and/or validating a simplified calculation model. Since the mesh based numerical model is considered to relatively accurately calculate stresses, strains and temperatures, the simplified calculation model may be improved in order to also provide relatively accurately and reliable stress-, strain- and temperature results. Accordingly, a further advantage with the mesh based numerical model is that it may be utilized when developing the simplified calculation model.

According to an example embodiment, the simplified calculation model may comprise a set of linear difference equations defining a relationship between load data and at least one of stress, strain and temperature.

According to an example embodiment, the life consumption calculation model may comprise a set of linear difference equations defining a relationship between load data and at least one of stress, strain and temperature. By approximating linear equations for known stress- and temperature analysis results, the method for predicting life consumption becomes faster while still being accurate. The method will thereby enable life consumption prediction for all available actual load sessions and additional nodes on the component.

According to an example embodiment, the load data may include at least one of time, altitude, aircraft speed, ambient temperature, inlet temperature, low pressure rotor speed, high pressure rotor speed, combustion pressure, turbine outlet temperature, turbine outlet pressure, power lever angle and control mode.

According to another example embodiment, the load data may be formed for a particular load session by a time sequence of machine conditions representative of data measured during the load session.

An advantage with creating machine conditions is that the speed of the calculation may be improved. Load data may be actual load data recorded in the load session. Alternatively, it may also be load data formed by a plurality of machine conditions.

According to an example embodiment, at least one of the parameter sets comprises at least one of: part number, safety factor, material data, filter settings, thermal model settings, stress model settings and failure mode settings.

For example, the part number relates to which component the parameter set is valid for. The safety factor includes settings regarding to the critical limit of the component, i.e., the safety factor determines how much of the theoretical life consumption is safe to utilize. The failure mode settings and material data may include data regarding the material of the component and properties of the data gathered from material tests. Test specimens of the material are put through a series of tests to evaluate the properties regarding how much cyclic stress, strain and temperature damage the material can manage before failure. The filter settings includes settings enabling to filter data such that a part of the entire set of data may be selected.

Furthermore, the parameter set may include a setting for the location of the point in a mesh. The thermal model settings and the stress models settings include settings relating to temperature and stress data to enable thermal and mechanical stress analysis calculation.

According to an example embodiment, the load sessions may be constituted by recorded loads from a flight mission of an aircraft.

Hereby, when an aircraft has been exposed to a flight mission, the engine of the aircraft is connected to a computer or the like which receives information relating to the specific flight and hence to the time dependent loads exerted to the engine during the flight mission. Accordingly, depending on different flight conditions during the specific mission such as e.g., weather, pilot behavior, etc. loads affecting the engine due to these conditions are provided from the engine in order to be able to calculate predicted life consumption for components during that specific mission.

According to an embodiment of the second aspect mentioned above, the system may further comprise a life consumption calculation unit configured to, for a plurality of load sessions, accumulate life consumption for each load session in each critical point.

According to a third aspect of the present disclosure, there is provided a computer program product comprising a computer readable medium having stored thereon a computer program, the computer program including program code portions for performing the above described method, when executed on a processing unit.

Further features of, and advantages with, the presently disclosed and claimed subject matter will become apparent when studying the appended claims and the following description. The skilled person realize that different features disclosed herein may be combined to create embodiments other than those described in the following, without departing from the scope of the claims appended hereto.

BRIEF DESCRIPTION OF THE DRAWINGS

The various aspects of this disclosure, including its particular features and advantages, will be readily understood from the following detailed description and the accompanying drawings, in which.

DETAILED DESCRIPTION OF EXEMPLARY EMBODIMENTS OF THE INVENTION

Figure 1:
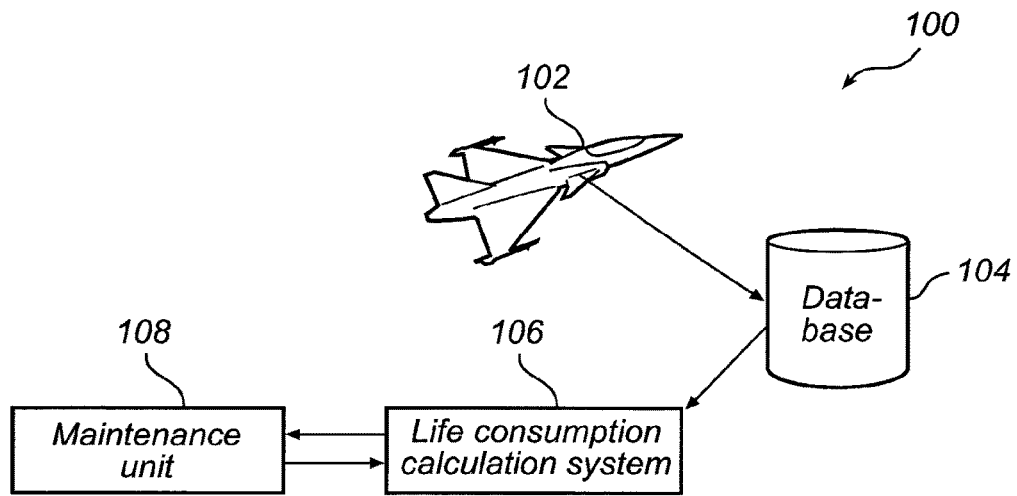
FIG. 1 is an example of a schematic illustration of an overall maintenance system.

The presently disclosed subject matter will now be described more fully hereinafter with reference to the accompanying drawings, in which exemplary embodiments are shown. This invention may, however, be embodied in many different forms and should not be construed as limited to the embodiments set forth herein; rather, these embodiments are provided for thoroughness and completeness, and to fully convey the scope of the presently disclosed subject matter to the skilled person. Like reference characters refer to like elements throughout.

FIG. 1 is an example of a schematic illustration of a maintenance system 100 for a machine. In FIG. 1 a fighter aircraft 102 is illustrated as an example of the machine, the fighter aircraft 102 comprising a plurality of mechanical parts out of which some are defined as critical life limited. Of course, other machines are possible within the scope of the disclosure and may, for example, be aircrafts (in general), gas/steam turbines, trucks, loaders, nuclear plants and wind turbines.

Figure 2:
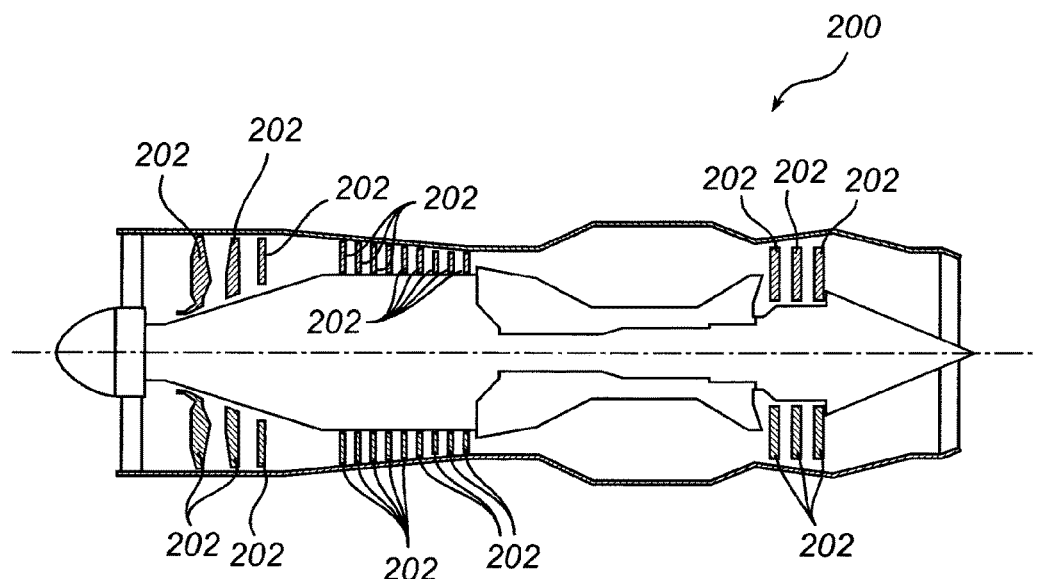
FIG. 2 is a schematic illustration of cross-section of a jet engine presenting a number of life limiting components.

In FIG. 2 there is depicted a cross-section of a jet engine 200 comprising a number of life limiting components 202 being especially exposed to forces that may cause critical failure to its components/parts. Typically, several of the components are rotating components or components exposed to high temperatures or other loads. A number of parameters are measured in the jet engine 200 during the time when the machine is in operation (defined as a load session), for example time, power lever angle, altitude, aircraft speed, ambient temperature, inlet temperature, low pressure rotor speed, high pressure rotor speed, combustion pressure, turbine outlet temperature, turbine outlet pressure, control mode of, e.g., the aircraft 102. For a fighter aircraft, in FIG. 1, the plurality of operational data is recorded and stored in a computer storage medium (not shown) on the fighter aircraft.

With further reference to FIG. 1, the load sessions with recorded data are adapted to be transferred (e.g., wired or wirelessly) to a database 104, possibly arranged on the "ground", e.g., separate from the aircraft 102. The data recorded during a flight is referred to as load data from a load session. The data stored in the database 104 is used by a life consumption calculation system 106 to predict the life consumption in a plurality of points on a component/part of e.g., the jet engine 200. The accumulated life consumption results may be transferred to a maintenance unit 108. The maintenance unit 108 may, after an indication (e.g., a determination made by the maintenance unit 108) that a component is approaching the end of its useful life, determine a suitable maintenance action. The maintenance action may for example be to service the component or to replace it. When a maintenance action has taken place, information of such an (maintenance) event is sent back to the life consumption calculation system 106, which event for example comprising information that the component has been serviced or exchanged for another (new) component, allowing the life consumption calculation system 106 to adapt its accumulated life consumption based on the accumulated life consumption of the (new) component. A (slightly) used component may also be installed, whereas a predicted life consumption adapted for the used component may be transferred from the maintenance unit 108 to the life consumption system 106 in a similar manner.

Figure 3:
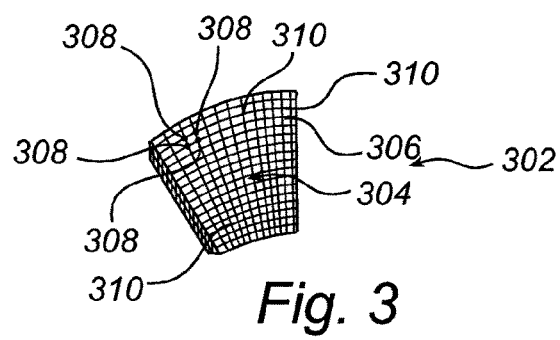
FIG. 3 illustrates a component with an applied mesh.

FIG. 3 illustrates one of the life limiting components 202 in FIG. 2. A mesh 304 provided to a 3D model of the component 302 is also illustrated. The mesh 304 is composed of a grid with a plurality of elements 306, where each corner of the element is a node forming a point. The elements 306 may have other nodes besides the nodes in each corner. A plurality of nodes 310 are selected as being potentially life limiting, i.e., critical points. Also, the potentially life limiting nodes 310 are illustrated in FIG. 3. By selecting a plurality of points, the method becomes more reliable even when the method is used to predict life consumption for a set of different load sessions. The mesh 304 generated for the 3D model of the component 302 may be used for analyzing temperature and mechanical stresses resulting from a predefined load acting on the component 302 by calculating a thermal and mechanical stress pattern with a mesh based numerical method. The thermal and mechanical stress pattern may be calculated by using a finite element analysis method in a finite element software. The programs used to calculate mechanical and temperature stresses may be any of ANSYS, ABAQUS, Hypermesh, COMSOL, or any other program able to handle finite element analysis. The element size influences the accuracy of the temperature and stress analysis. An increased number of elements 306 for a component improve the accuracy of the calculations. When the mechanical and thermal loads are calculated, the thermal and mechanical stress pattern will display one zone or a plurality of zones where the mechanical stress and temperature is higher than in the surrounding area. The predicted life consumption in the plurality of potentially life limiting nodes may be calculated for one or several load sessions to select a set of nodes, where each node is selected from a zone with critical life consumption. In a zone with critical life consumption, for example the area encircling a circular opening, the predicted life consumption may be the same for several nodes. Therefore, it may be possible to select only one or a few of those nodes to represent all the nodes in the zone with critical life consumption.

The node that finally turns out to be the life limiting node may not be life limiting for another type of load session. The life limiting locations thus depends on the type of load sessions experienced by the component. By considering a plurality of nodes 310, the method for predicting life consumption becomes safer and more reliable. Moreover, by adapting the operation of the machine, the addition to the life consumption in a specific node may be controlled.

Furthermore, the calculated stresses and temperature may be time-dependent parameters. By calculating stresses and temperatures as a function of time, the load history of the components is taken into account and may be included in the mechanical and thermal load data.

Figure 4:
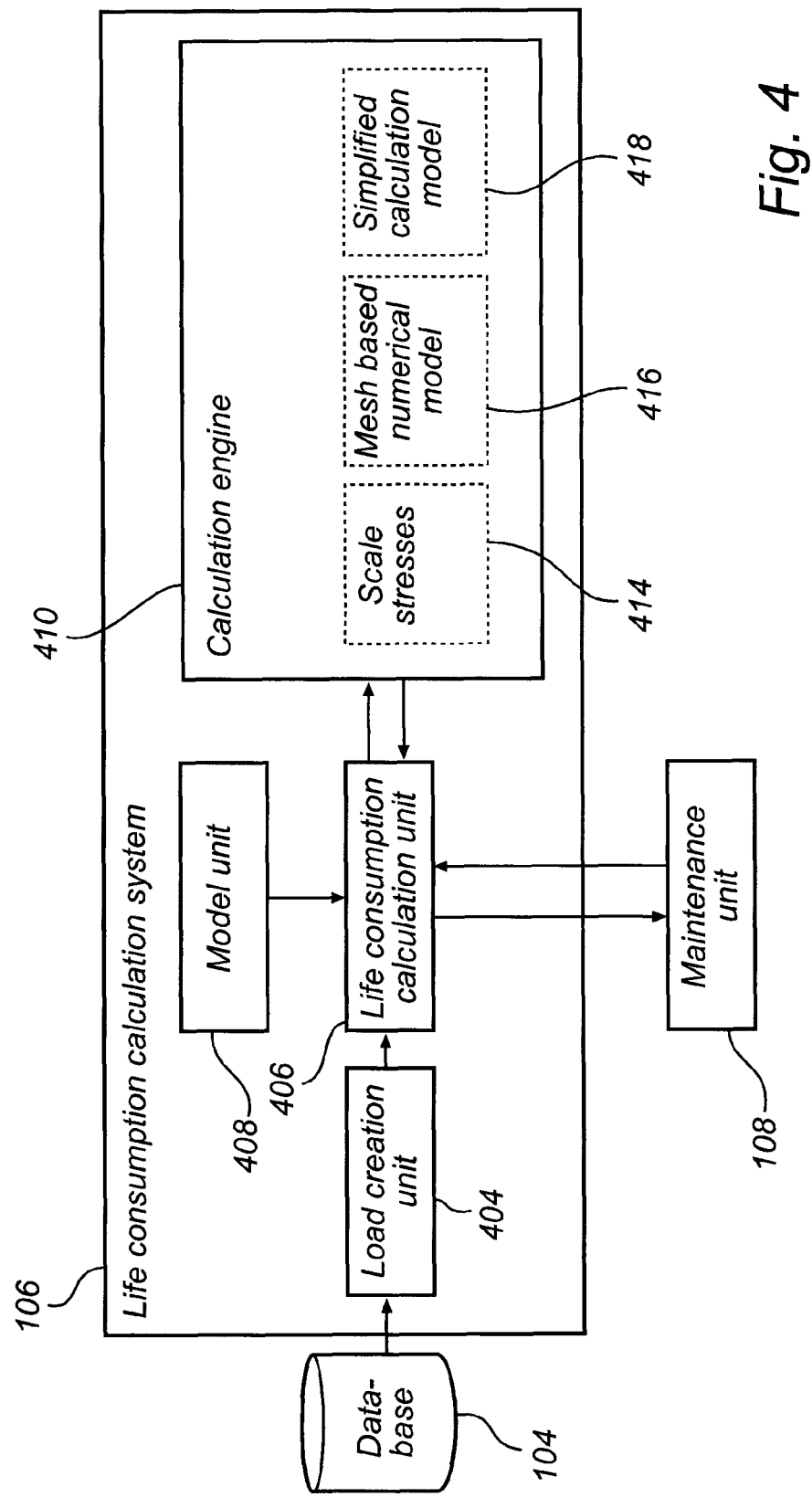
FIG. 4 schematically illustrates the life consumption calculation system.

In FIG. 4 the life consumption calculation system 106 illustrated in FIG. 1 is schematically illustrated in more detail. The load sessions stored in the database 104 are transferred to the life consumption calculation system 106. The data from the database 104 is processed in the load creation unit 404 and may be transferred to mechanical and thermal load data. A life consumption calculation unit 406 is arranged to receive the preprocessed data from the load creation unit 404. The life consumption calculation unit 406 is further arranged to receive a plurality of parameter sets from a model unit 408. The plurality of parameter sets are associated with a number of critical points of each component and are determined by the model unit 408 or otherwise accessed from the model unit 408. The life consumption calculation unit 406 is further adapted to be coupled to the data from the load creation unit 404 with the parameter sets from the model unit 408, and to transfer the parameter sets and the load data to a calculation engine 410, where the predicted life consumption is calculated. The life consumption calculation unit 406 is further adapted to receive the results from the calculation engine 40 and to store the predicted life consumption in a memory or in, for example, a database.

A maintenance unit 108 is adapted to receive the predicted life consumption for all critical points on a component from the life consumption calculation unit 406. When a maintenance action has taken place, the maintenance unit 108 is adapted to return information regarding this action to the life consumption calculation unit 406. If a component is replaced, the stored data of the life consumption for that particular component is reset.

The load creation unit 404 is arranged to check for errors in the input data and to frequency filter the data. The load creation unit 404 may also identify machine conditions and store the conditions in a database. A machine condition is found based on the load data. The speed of the predictions may be improved by creating machine conditions from data measured during the load sessions. The creation of machine conditions is based on storing machine condition parameters in a database calculated from machine states in operation of the machine. Hereby, instead of performing calculations for each machine state for the operational machine, the resulting machine conditions may be found by matching measured data from the machine with corresponding predefined sets of parameter values in the database. Such a matching procedure is generally more time efficient than performing calculations. A machine state is defined as a state of the machine at a specific point in time defined by specific values of the measured parameters. An additional advantage is that calculations resulting in non-converging solutions may be avoided.

The plurality of parameter sets may, e.g., be stored as XML (eXtensible Markup Language) files, or the like. The parameters may include part number, safety factor, material data, filter settings, thermal model settings, stress model settings, failure mode settings and reliability limits. The part number determines for which component the parameter set is valid. The safety factor includes settings regarding to the critical limit of the component. The safety factor determines how much of the theoretical life consumption is safe to utilize. The failure mode settings and material data may include data regarding the material of the component and properties of the data gathered from material tests. Test specimens of the material are put through a series of tests to evaluate the properties regarding how much cyclic stress, strain and temperature damage the material can manage before failure.

The calculation engine 410 is adapted to use different life consumption calculation models based on the parameter sets for the critical points. In the illustrated example, the models include a scale stressing model 414, a mesh based numerical model 416, and a linear calculation model 418.

In a case where the point is located on a cold part of the component, i.e., when the thermal stresses are considered negligible, the plurality of parameter set may include a setting to implement a simple scaling scheme to scale the stresses present in any points. This is referred to as a scale stressing model 414. In this case, the parameter set may include scaling load, load level and stress distribution. The scaling load relates to which loads the scaling will be based on high pressure speed or low pressure speed, on high pressure torque or low pressure torque, or on force, while the load level and the stress distribution enable stresses to be calculated based of a specific load level. Furthermore, the parameter set may include a setting for the location of the point in a mesh, i.e., an FE-model node.

When the thermal stresses may not be neglected, the parameter set may comprise settings to perform thermal and mechanical stress analysis calculation in the calculation engine 410 using a mesh based numerical model 416. The mesh based numerical model 416 of the life calculation engine 410 may calculate thermal and mechanical stresses from loads with a mesh based numerical method, e.g., a finite element method. In this case, the parameter set includes settings for a coarse mesh which is not as time-consuming calculation or as accurate as an FE-model having a denser mesh. Furthermore, a scale matrix can be used when scaling the elements from coarse elements to fine element. The thermal model settings and the stress models settings, may include settings relating to temperature and stress data adapted to function as input data to the mesh based numerical model 416.

The speed of the predictions of life consumption may be improved by approximating a simplified calculation method instead of using a complete mesh based numerical method to calculate stresses. By calibrating a simplified calculation model 418, using known results from a numerical model calculating stresses with a set of load input data, the simplified calculation model 418 may thereafter be used for other mechanical and thermal loads. Hereby, a less time consuming simplified calculation is provided while still being able to provide reliable results in terms of, e.g., stresses and temperatures of the component. The linear calculation model 418 may, for example, be linear equations, such as a linear ARX model, approximated to several pre-calculated load sessions of mechanical and thermal loads calculated with the mesh based numerical model 416. The linear ARX model comprises a set of linear difference equations calculating the parameters based on given input and output. The approximated linear equations may thereafter be utilized for another set of data with mechanical and temperature loads to increase the calculation speed of the life consumption model. The simplified calculation model 418 may be verified by comparing at least one of the stresses, temperature and predicted life consumption for another input data calculated with the simplified calculation model 418 against results from the mesh based numerical model 416. Details of how to implement such a linear model are disclosed in a co-pending application having serial number PCT/SE2012/000096, filed Jun. 19, 2012, and entitled "METHOD FOR GENERATING A SIMPLIFIED CALCULATION MODEL AND METHOD FOR PREDICTING LIFE CONSUMPTION OF A COMPONENT", herewith incorporated by reference herein in its entirety.

For the simplified calculation model 418 in the calculation engine 410, the input data settings and parameters regarding the simplified calculation model 418 are stored in a setting based on the refined model for the finite element nodes, i.e. FE-model fine node. The stresses and/or strains and the temperature in the point may be calculated with the simplified calculation model 418.

Moreover, the virtual models used in the product development phase may be used to create the parameter sets. The models are developed with the support of computer clusters until it is validated. The validated parameter sets calculate the predicted life consumption with the calculation engine for artificial load sessions. Load data may be obtained by performing load sessions in an engine for a controlled environment, for example in a testing facility. The validated parameter sets are developed further for actual load sessions. After this step, the parameter set is reviewed, and validated if it is found to work properly. The validated parameter set for actual load data is then ready to be used in machine operation. The calculation engine 410 is configured to calculate the predicted life consumption for both artificial and actual load sessions during the development phase of the models. The parameter sets may be used to further develop and redesign components by evaluating the predicted life consumption for predefined load sessions.

The parameter sets may be continuously updated such that a more accurate life consumption may result from the calculation, when recalculating the load data from the load sessions with the updated parameter set. A new parameter set may be introduced at any time during operation of the system. The parameter sets may further be used during design phases of components. By predicting the life consumption of a plurality of points, the results may be evaluated and the design may be altered to strengthen weak portions of the component. If the component is altered, a new parameter set may be created adapted to the new geometry.

The life consumption calculation system 106 may be realized as a combination of hardware and software elements. In particular, any or all of the blocks 404-410 may be realized by computer program code executed by one or several processing units. The processing units may form part of a larger computer server system or comprise a network of interconnected processors. The computer program code may be stored on a computer readable medium such as a removable nonvolatile random access memory, a hard disk drive, a floppy disk, a CD-ROM, a DVD-ROM, a USB memory, an SD memory card, or a similar computer readable medium known in the art.

Figure 5:
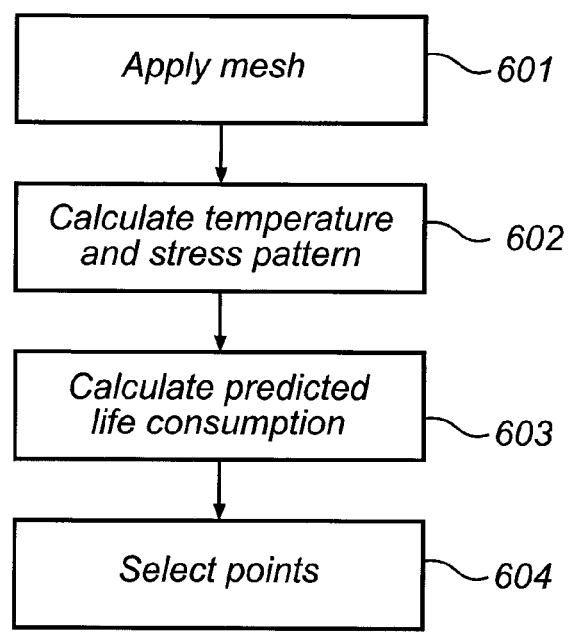
FIG. 5 illustrates a flow chart of an embodiment of the method.

FIG. 5 shows a flow chart describing the steps of an embodiment of the method for selecting the plurality of critical points when predicting life consumption of a component.

At step 601, a mesh is applied to a 3D model of the life limiting component. The mesh may be generated by the mesh based numerical method or by another mesh generating method. If another mesh generating method is used, the mesh is imported to the mesh based numerical method. The mesh is composed of a grid with a plurality of elements, where each corner of the element is a node forming a point. The element size of the mesh may vary depending on the required accuracy of the predictions and the design of the component. The mesh is used to calculate a thermal and mechanical stress pattern by means of a mesh based numerical method at step 602. The mesh based numerical method yields temperature and stress in each point in the mesh, where the nodes 308 in the mesh are being referred to as points. In step 603, the predicted life consumption is calculated for nodes/points 308 in the component. The life consumption may be calculated for at least one load session. Alternatively, the life consumption may be calculated for several predetermined load sessions since different load session may affect different part of the component and thus results in different critical points.

In the subsequent step 604, a plurality of critical points 310 may be selected based on the results of the predicted life consumption. Critical points 310 are selected from the component with a high life consumption, which may reach the critical life consumption limit fast. One load session may be considered, when selecting the critical points 310 of a component. Alternatively, different load sessions may be considered, to ensure that all the critical points 310 have been selected. When the critical points 310 have been selected, the life consumption may be calculated for a plurality of load sessions experienced by the component in the machine, which is described in FIG. 6.

Figure 6:
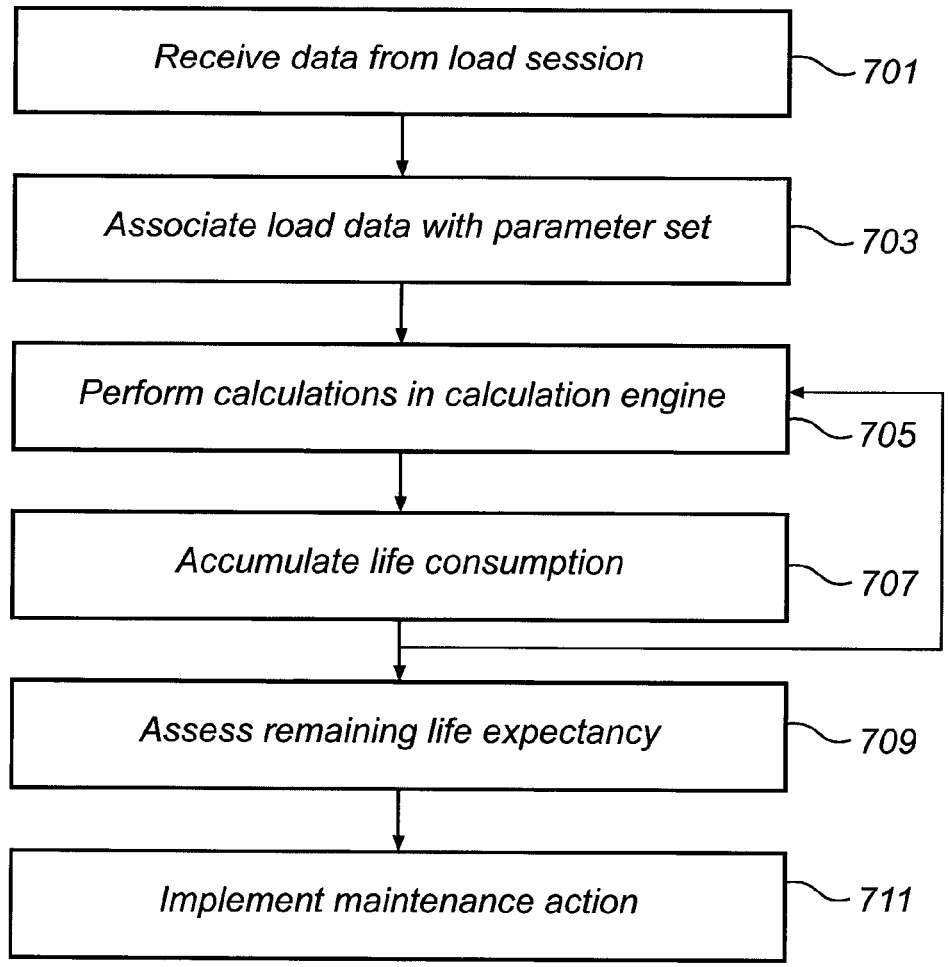
FIG. 6 illustrates an exemplary flow chart of the system described in FIG. 4.

FIG. 6 illustrates an exemplary flow chart of the life consumption calculation system 106 described in FIG. 4.

In a first step 701, the data is received from the load session stored in a database 104. The data is processed as described with reference to the load creation unit 404.

In the next step 703, the load data is associated with parameter sets from the model unit 408.

In the subsequent step 705, the life consumption is calculated by the calculation engine 410 with the load data and the associated parameter sets as input data. The parameter sets determines which of the three calculation models 414, 416, 418 the calculation engine 410 should use to calculate the life consumption.

In the following step 707, the calculated life consumption for a specific point is accumulated with the previously calculated life consumptions such that the total life consumption is presented for a point. A predicted life consumption is calculated for each of the selected critical points. The life consumption is accumulated in the life consumption calculation unit 406 described in FIG. 4. The arrow in FIG. 6 following step 707 to step 705 illustrates, that the accumulation of the life consumption in each critical point is repeated for each load session.

In the next step 709, the accumulated life consumption is assessed based on how close the accumulated life consumption is compared to the critical limit, the assessment is based on the safety factor setting in the parameter set.

Finally, in step 711, a maintenance action is implemented, if the accumulated life consumption is considered to be close to the critical limit. The type of maintenance action may be determined by the life consumption calculation unit described in FIG. 4. The implemented maintenance action may, for example, replace the component with a new or a used spare part. If a new or a used spare part is installed in the machine, information of this action is sent to the life consumption calculation unit 406 and the accumulated life consumption is reset to zero for a new component or set to the accumulated life consumption for the spare part.

The person skilled in the art realizes that the present invention by no means is limited to the embodiments described above. On the contrary, many modifications and variations are possible within the scope of the appended claims. For example, the design of the system illustrated in FIG. 4 may be different, while still performing the steps of the claimed method. Also, the details of the parameter sets and calculation models only serve as examples, and can be replaced or modified based on the implementation.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. A single unit may fulfill the functions of several items recited in the claims. The mere fact that certain measures are recited in mutually different dependent claims does not indicate that a combination of these measured cannot be used to advantage.

The invention claimed is:

1. A method for operating an engine, comprising:
receiving load data from a predetermined load session of an engine,
accessing a plurality of parameter sets, each associated with a respective critical point of a component in said engine, whereby a plurality of critical points are accessed, each of which points has a respective critical life consumption,
for each critical point, calculating a life consumption using one of a plurality of life consumption calculation models receiving said load data and said parameter sets as input,
wherein a selection of the life consumption calculation model is based, at least in part, on the parameter sets associated with each critical point,
wherein said critical points considered to have critical life consumption are selected by:
applying a mesh to a geometric model of a component, said mesh comprising a plurality of nodes, wherein at least each corner of the component is a node;
calculating at least one of a stress pattern and a temperature pattern of said mesh for at least one predetermined load session by at least one of a scaling method, mesh based numerical method, or a simplified calculation method that includes at least one of a usage count and a set of linear differential equations;
calculating a predicted life consumption for each of the plurality of nodes based on said at least one of said stress pattern and said temperature pattern for each predetermined load session using the life consumption calculation model;
selecting, based on said predicted life consumption, a plurality of nodes considered to have a critical life consumption, said plurality of selected nodes forming said critical points; and
altering, during a further load session, at least one operational setting of the engine including at least one of power level angle, altitude, aircraft speed, ambient temperature, inlet temperature, low pressure rotor speed, high pressure rotor speed, combustion pressure, turbine temperature, turbine outlet pressure, and a control mode of the engine such that at least one of a more evenly distributed life consumption is accumulated for the selected critical points on the component in said engine compared to a distributed life consumption for the selected critical points on the component as predicted in the predetermined load session or such that more damage is accumulated in components in said engine with selected critical points which are cheaper to replace or have a low accumulated life consumption compared to other components in said engine.

2. The method according to claim 1, further comprising:
performing the method of claim 1 for a plurality of load sessions, and
for each load session, accumulating respective life consumptions in each critical point.

3. The method according to claim 1, wherein said critical points considered to have critical life consumption are selected by:
applying a mesh to a geometric model of said component, said mesh comprising a plurality of nodes;
calculating at least one of a stress pattern, and a temperature pattern, of said mesh for at least one predetermined load session by means of a mesh based numerical method;
calculating a predicted life consumption for each of the plurality of nodes based on said at least one of said stress pattern, and said temperature pattern, for each predetermined load session using the life consumption calculation model; and
selecting, based on said predicted life consumption, a plurality of selected nodes considered to have a critical life consumption, said plurality of selected nodes forming said critical points.

4. The method according to claim 3, wherein the mesh based numerical method includes a finite element analysis.

5. The method according to claim 1, further comprising:
determining a critical limit of the life consumption; and
determining a maintenance action for the component, when the life consumption in one of said critical points on the component has reached the critical limit.

6. The method according to claim 1, further comprising:
modifying the parameter sets for a critical point to modified parameter sets; and
recalculating the predicted life consumption for said critical point using the life consumption calculation model with the respective modified parameter sets for a set of previously calculated load sessions.

7. The method according to claim 1, wherein said life consumption calculation model comprises a mesh based numerical model.

8. The method according to claim 7, wherein said mesh based numerical model is used for at least one of training, and validating, a simplified calculation model.

9. The method according to claim 8, wherein said simplified calculation model comprises a set of linear difference equations defining a relationship between load data and at least one of stress, strain, and temperature.

10. The method according to claim 1, wherein said life consumption calculation model comprises a set of linear difference equations defining a relationship between load data and at least one of stress, strain, and temperature.

11. The method according to claim 1, wherein the load data includes at least one of time, altitude, aircraft speed, ambient temperature, inlet temperature, low pressure rotor speed, high pressure rotor speed, combustion pressure, turbine outlet temperature, turbine outlet pressure, power lever angle, and control mode.

12. The method according to claim 1, wherein the load data for a particular load session is formed by a time sequence of machine conditions representative of data measured during said load session.

13. The method according to claim 1, wherein at least one of the parameter sets comprises at least one of: part number, safety factor, material data, filter settings, thermal model settings, stress model settings, and failure mode settings.

14. A system for operating an engine, comprising:
a load creation unit programmed to receive load data from a predetermined load session of an engine;
a model unit programmed to access a plurality of parameter sets, each associated with a respective critical point of a component in said engine, whereby a plurality of critical points are accessed, each of which points has a respective critical life consumption; and
a calculation unit programmed to calculate a life consumption in each critical point using a life consumption calculation model receiving said load data and said parameter sets as input, wherein a selection of the life consumption calculation model is based, at least in part, on the parameter sets associated with each critical point,
wherein the calculation unit is further programmed to select said critical points considered to have critical life consumption by:
applying a mesh to a geometric model of a component, said mesh comprising a plurality of nodes, wherein at least each corner of the component is a node;
calculating at least one of a stress pattern and a temperature pattern of said mesh for at least one predetermined load session by at least one of a scaling method, mesh based numerical method, or a simplified calculation method that includes at least one of a usage count and a set of linear differential equations:
calculating a predicted life consumption for each of the plurality of nodes based on said at least one of said stress pattern and said temperature pattern for each predetermined load session using the life consumption calculation model;
selecting, based on said predicted life consumption, a plurality of nodes considered to have a critical life consumption, said plurality of selected nodes forming said critical points; and
altering, during a further load session, at least one operational setting of the engine including at least one of power level angle, altitude, aircraft speed, ambient temperature, inlet temperature, low pressure rotor speed, high pressure rotor speed, combustion pressure, turbine temperature, turbine outlet pressure, and a control mode of the engine such that at least one of a more evenly distributed life consumption is accumulated for the selected critical points on the component in said engine compared to a distributed life consumption for the selected critical points on the component as predicted in the predetermined load session or such that more damage is accumulated in components in said engine with selected critical points which are cheaper to replace or have a low accumulated life consumption compared to other components in said engine.

15. The system according to claim 14, further comprising a life consumption calculation unit that is programmed to, for a plurality of load sessions, accumulate life consumption for each load session in each critical point.

16. The system according to claim 15, wherein the life consumption calculation unit is further programmed to determine a critical limit of the life consumption and to determine a maintenance action for the component, when the life consumption in one of said critical points on the component has reached the critical limit.

17. The system according to claim 14, wherein the calculation unit is further programmed to calculate the life consumption in each critical point using a set of linear difference equations defining a relationship between load data and at least one of stress, strain, and temperature.

18. The system according to claim 14, wherein the load creation unit is further programmed to receive load data including at least one of time, altitude, aircraft speed, ambient temperature, inlet temperature, low pressure rotor speed, high pressure rotor speed, combustion pressure, turbine outlet temperature, turbine outlet pressure, power lever angle, and control mode.

19. The system according to claim 14, wherein the load creation unit is further programmed to form load data for the load session by a time sequence of machine conditions representative of data measured during the load session.

* * * * *